United States Patent
Hayata

(10) Patent No.: US 6,657,799 B2
(45) Date of Patent: Dec. 2, 2003

(54) WIRE BONDING APPARATUS

(75) Inventor: Shigeru Hayata, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/307,080

(22) Filed: Nov. 27, 2002

(65) Prior Publication Data

US 2003/0099049 A1 May 29, 2003

(30) Foreign Application Priority Data

Nov. 27, 2001 (JP) ........................................ 2001-360218

(51) Int. Cl.[7] ................................................ G02B 5/22
(52) U.S. Cl. .................. 359/885; 228/4.5; 228/103; 228/105; 228/9; 228/180.5; 348/86; 348/87; 348/90; 348/125; 348/126; 382/141
(58) Field of Search .................... 359/885; 228/102, 228/105, 180.5, 9, 10, 103, 8, 4.5

(56) References Cited

U.S. PATENT DOCUMENTS 5,516,023 A * 5/1996 Kono ......................... 228/4.5
5,832,595 A * 11/1998 Maruyama .................. 29/829

FOREIGN PATENT DOCUMENTS

JP       2001-203234      *  7/2001

* cited by examiner

Primary Examiner—John Juba
Assistant Examiner—Leo Boutsikaris
(74) Attorney, Agent, or Firm—Koda & Androlia

(57) ABSTRACT

A wire bonding apparatus including a bonding tool that performs bonding on a bonding part, a position detection camera which has a lens barrel and images the bonding part, a light source which emits illuminating light downward through the lens barrel, and a light path conversion device that directs an image of an area near the lower end of the tool to the position detection camera. The light path conversion device includes a wavelength-selective filter that is provided so as to be within a light path of the image of the area near the lower end of the tool. The wavelength-selective filter allows illuminating light of the light path conversion device to pass therethrough but prevents the illuminating light from the lens barrel side from passing therethrough.

4 Claims, 3 Drawing Sheets

WIRE BONDING APPARATUS

BACKGROUND OF THE INVENTION

1. Field of the Invention

The present invention relates to a wire bonding apparatus and more particularly to a wire bonding apparatus that includes a light path conversion means which directs an image of the area near the lower end of a bonding tool to a position detection camera.

2. Prior Art

A typical wire bonding apparatus includes a bonding tool (merely called "tool") which performs bonding on a bonding part, a position detection camera which has a lens barrel and images the bonding part, and a light path conversion means which directs an image of the area near the lower end of the tool to the lens barrel. Japanese Patent Application Laid-Open (Kokai) No. 2001-203234, for instance, discloses a wire bonding apparatus as described above. Though not described in this prior art, illuminating light is emitted downward through the lens barrel so that the position detection camera can acquire a clear image of the bonding part.

In the above structure, if an image of the tool or an image of the tool and a reference member is acquired while the light source on the lens barrel side is lit, the illumination of the light source will be reflected by the tool or the reference member, and the overall contrast drops, thus causing a deterioration in the image that is acquired. Such an image tends to contain an element of error when image processing is performed. Such effects of the light source can be eliminated by switching off the light source or by lowering the light quantity.

When investigating the bending of the wire (tail) that extends from the lower end of the tool, the tail length or the diameter of the ball that is formed by melting the wire tail, it is important that the results be immediately fed back to a controlling section. Accordingly, switching off of the light source hinders the productivity and is therefore undesirable. In cases where a halogen light source which is inexpensive and superior in terms of illumination intensity is used as the light source, switching the light source on and off is particularly undesirable. This is because the switching time of the illuminating light amount of halogen light source is generally slow.

SUMMARY OF THE INVENTION

The object of the present invention is to provide a wire bonding apparatus that includes a light path conversion means that causes no deterioration of the quality of acquired image even if the light source that provides illumination from the lens barrel of the position detection camera is lit.

The above object is accomplished by a unique structure of the present invention for a wire bonding apparatus that includes: a tool that performs bonding on a bonding part, a position detection camera which has a lens barrel and images the bonding part, a light source which emits illuminating light downward through the lens barrel, and a light path conversion means which directs an image of an area near the lower end of the tool to the lens barrel; and in the present invention, a wavelength-selective filter is provided in the light path conversion means so as to be within a light path of the image of the area near the lower end of the tool, the wavelength-selective filter allowing illuminating light of the light path conversion means to pass therethrough and prevents illuminating light from the lens barrel side from passing therethrough.

In the above structure, the wavelength-selective filter is disposed above a reflective member which is provided in the light path conversion means and reflects the image of the area near the lower end of the tool upward.

Instead, the wavelength-selective filter can be disposed on an image-light incident side of the reflective member.

In addition, in the present invention, the wavelength-selective filter is disposed so as to incline at an angle that is greater than numerical aperture of the lens barrel of the position detection camera.

DETAILED DESCRIPTION OF THE INVENTION

Figure 1:
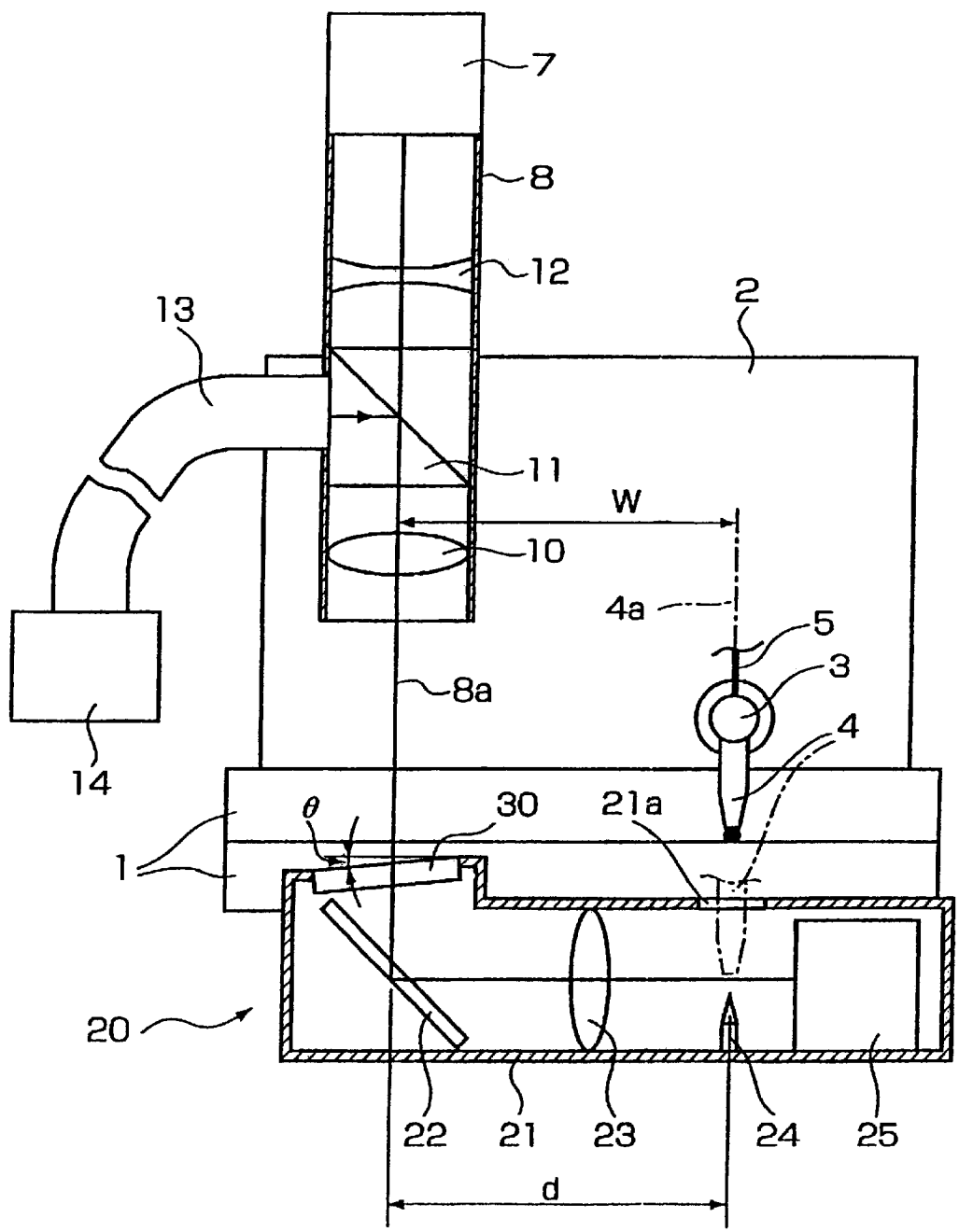
FIG. 1 is a sectional front view of the essential portion of the first embodiment of the wire bonding apparatus according to the present invention.
Figure 2:
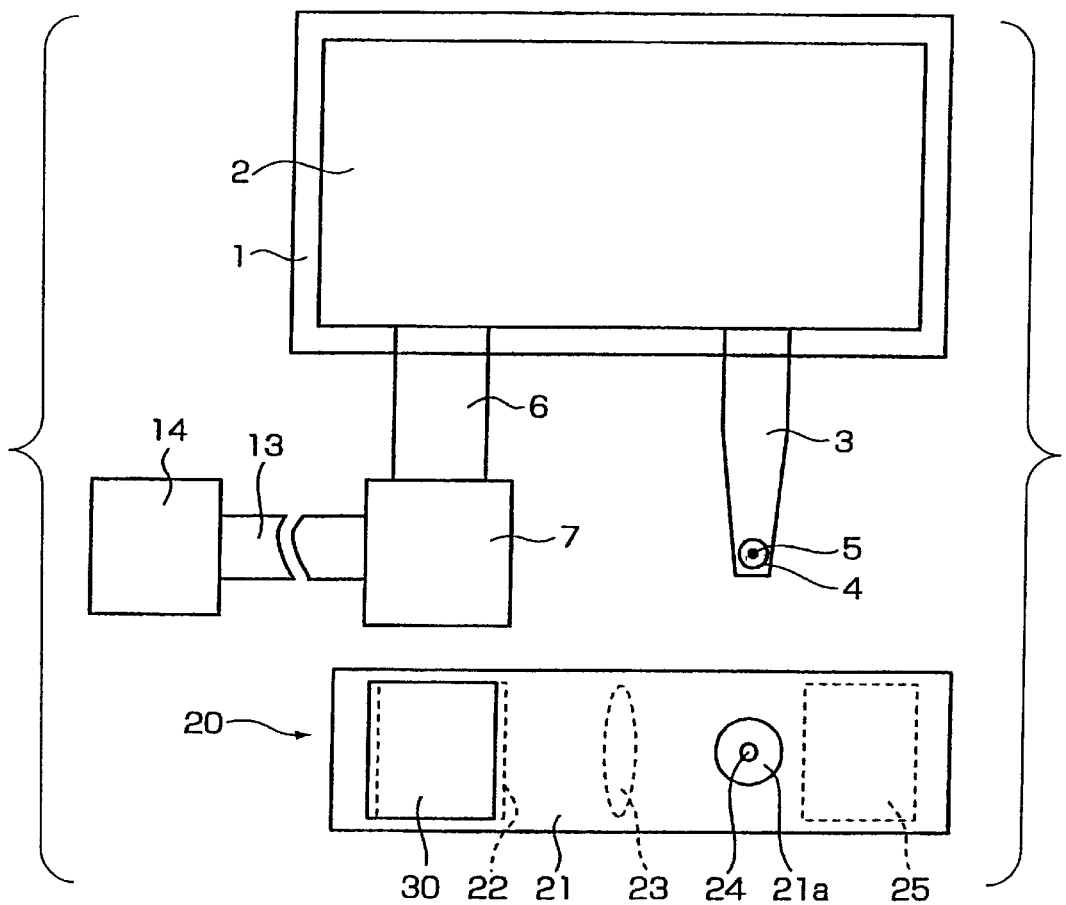
FIG. 2 is a top view of FIG. 1.

The first embodiment of the wire bonding apparatus of the present invention will be described with reference to FIGS. 1 and 2.

A bonding arm 3 is disposed so as to be raised and lowered on a bonding head 2 which is mounted on an XY table 1 that is driven in the directions of the X and Y axes or in the horizontal direction. The up and down movement of the bonding arm 3 is made by a vertical driving means which is not shown in the drawings. A tool 4 is attached to the tip end of the bonding arm 3, and a wire 5 passes through this tool 4. Furthermore, a camera holder 6 is fastened to the bonding head 2, and a lens barrel 8 that includes a position detection camera 7 including an imaging element (CCD (Charge Coupled Device), CMOS (Complementary Metal-Oxide Semiconductor), etc.) is fastened to the tip end of the camera holder 6.

From bottom to top, an object lens 10, a half-mirror 11 and a focusing lens 12 are disposed inside the lens barrel 8; and the position detection camera 7 is fastened to the upper end of the lens barrel 8. One end of an optical fiber 13 is attached to the side of the lens barrel 8 so as to face the half-mirror 11, and a light source 14 such as a halogen lamp, LED (Light Emitting Diode), etc. is connected to the other end of the optical fiber 13. The optical axis 8a of the lens barrel 8 and the axial center 4a of the tool 4 are offset by a distance W so that the tool 4 and bonding arm 3 do not interfere with the visual field of the position detection camera 7 when a reference pattern on the bonding part is imaged by the position detection camera 7 via the lens barrel 8.

A light path conversion means 20 which directs image light of at least the area near the lower end of the tool 4 to the lens barrel 8 is disposed near a bonding stage (not shown) which positions and carries the bonding part (not shown). From the left side in FIG. 1, a mirror 22, lens 23, a reference member 24 and an illumination means 25 are disposed inside the case 21 of the light path conversion means 20. The mirror 22 is disposed at an angle of 45° with reference to the horizontal direction. The distance d from the center of the mirror 22 to the center of the reference member 24 is set to be more or less equal to the offset amount W between the optical axis 8a of the lens barrel 8 and the axial center 4a of the tool 4. A tool insertion hole 21a is formed in the case 21 so as to be above the reference member 24. The mirror 22 is used as a reflective member; and it is also possible to use a prism instead.

A wavelength-selective filter 30 is provided in the light path conversion means 20. The wavelength-selective filter 30 blocks the entry of the illuminating light from the light source 14 but allows the passage of the illuminating light from the illumination means 25. The wavelength-selective filter 30 is disposed so as to be above the mirror 22, and this wavelength-selective filter 30 acts as a cover for the case 21 of the light path conversion means 20. The wavelength-selective filter 30 can be disposed in a horizontal attitude; however, if the filter 30 is horizontal, there is a danger that the illuminating light from the light source 14 is reflected so that this light enters the position detection camera 7. This can be prevented by coating the surface of the wavelength-selective filter 30 with an anti-reflection agent. However, such a treatment increases the cost. Accordingly, in the shown embodiment, the wavelength-selective filter 30 is inclined by an angle of θ degrees with respect to the horizontal direction. It is desirable that this angle of θ degrees be larger than the numerical aperture (NA) of the object lens 10. If the inclination angle θ of the wavelength-selective filter 30 is larger than the numerical aperture of the object lens 10, then the reflected light from the wavelength-selective filter 30 is prevented from entering the object lens 10.

With the above structure, when the correction of the offset amount W is made, the XY table 1 is driven so that the axial center 4a of the tool 4 is positioned above the reference member 24. Next, the bonding arm 3 is lowered by the vertical driving means (not shown), so that the tool 4 is lowered to the height almost touching the reference member 24 via the tool insertion hole 21a of the light path conversion means 20. As a result, the image of the tool 4 and reference member 24 passes through the lens 23 as a shadow with respect to the light from the illumination means 25. This image is reflected by the mirror 22 and is acquired by the position detection camera 7 via the wavelength-selective filter 30, object lens 10, half-mirror 11 and focusing lens 12. The positional relationship between the axial center 4a of the tool 4 and the reference member 24 is obtained from this image. Afterward, the correction value for the offset amount W is determined by the same method as disclosed in Japanese Patent Application Laid-Open (Kokai) No. 2001-203234.

Wire bonding methods typically include a process that forms a ball on the wire 5 (tail) extending out of the lower end of the tool 4. When the tool 4 is inserted into the tool insertion hole 21a of the light path conversion means 20 as described above with a tail formed on the wire or with a ball formed on the wire, the tail length is obtained by processing the image of the tail or the image of the bending of the tail in cases where the ball has not yet been formed, and the ball diameter is obtained by processing the image of the ball in cases where the ball has been formed. Likewise, conditions of damage or contamination, etc. of the lower end portion of the tool 4 is also observed. In this case, the reference member 24 can be omitted.

In cases where an image of the area near the lower end of the tool 4 is obtained as described above, the illuminating light from the light source 14 is prevented from entering the light path conversion means 20 even if the light source 14 is left lit. Accordingly, there is no deterioration of the image. Furthermore, since the inclination angle θ of the wavelength-selective filter 30 is set at an angle that is larger than the numerical aperture of the object lens 10, even if the illuminating light from the light source 14 is reflected by the wavelength-selective filter 30, this reflected light is prevented from entering the lens barrel 8. Though there are no restrictions on the light source 14, a halogen lamp is especially effective in the shown embodiment.

The second and third embodiments of the wire bonding apparatus of the present invention will be described with reference to FIGS. 3 and 4.

Figure 3:
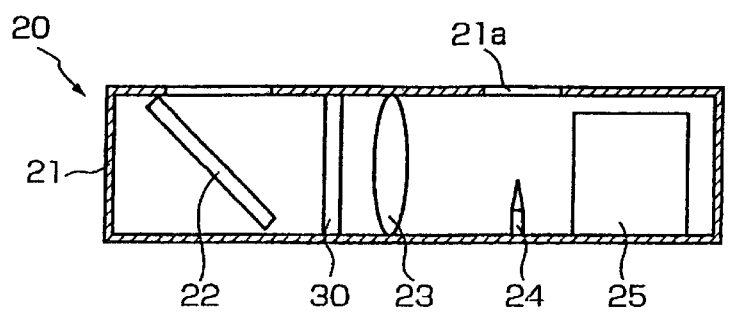
FIG. 3 is a sectional front view of the light path conversion means used in the second embodiment of the wire bonding apparatus of the present invention.
Figure 4:
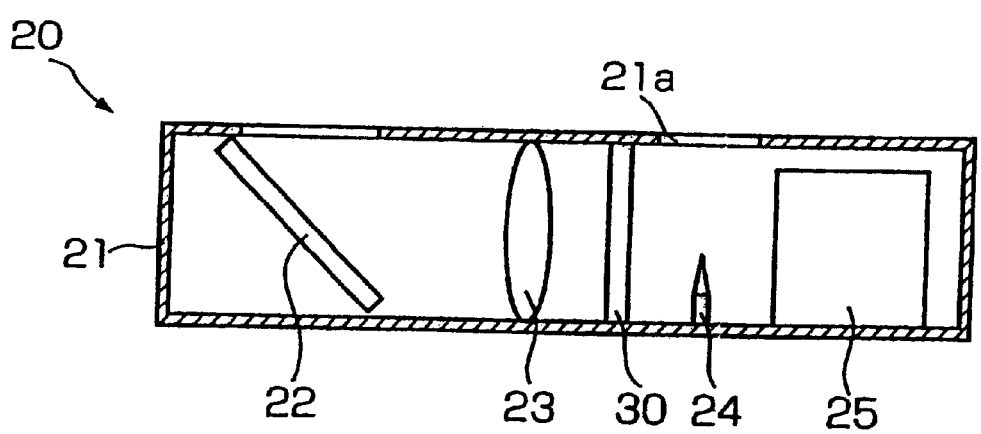
FIG. 4 is a sectional front view of the light path conversion means used in the third embodiment of the wire bonding apparatus of the present invention.

In the structure of FIG. 3, the wavelength-selective filter 30 is disposed between the mirror 22 and the lens 23; and in the structure of FIG. 4, the wavelength-selective filter 30 is disposed between the lens 23 and the reference member 24. In these structures, as well, the illuminating light from the light source 14 is at least prevented from being reflected by the object (tool 4 and reference member 24) and thus prevented from entering the lens barrel 8.

The light path conversion means 20 directs the image of the area near the lower end of the tool 4 to the lens barrel 8; accordingly, the mirror 22 that changes the direction of the image of the tool 4 is necessary. However, as disclosed in Japanese Patent Application Laid-Open (Kokai) No. 2001-203234, the lens 23 is not absolutely necessary; and when the lens 23 is not used, it goes without saying that the wavelength-selective filter 30 is installed either above the mirror 22 or on the left side (in each Figure) of the mirror 22.

As seen from the above, according to the present invention, the wire bonding apparatus includes: a tool that performs bonding on a bonding part, a position detection camera which has a lens barrel and images the bonding part, a light source which emits illuminating light downward through the lens barrel, and a light path conversion means that directs an image of an area near the lower end of the tool to the lens barrel; and a wavelength-selective filter, which allows the illuminating light of the light path conversion means to pass therethrough but prevents the illuminating light from the lens barrel side from passing therethrough, is provided in the light path conversion means so as to be within the light path of the image of the area near the lower end of the tool. Accordingly, no deterioration occurs in the quality of the acquired image even if the light source that emits light from the lens barrel of the position detection camera is lit.

What is claimed is:

1. A wire bonding apparatus comprising:
   a tool which performs bonding on a bonding part,
   a position detection camera which has a lens barrel and images said bonding part,
   a light source which emits illuminating light downward through said lens barrel, and
   a light path conversion means which directs an image of an area near a lower end of said tool to said lens barrel; wherein
   a wavelength-selective filter is provided in said light path conversion means within a light path of said image of said area near said lower end of said tool, said wavelength-selective filter allowing illuminating light of said light path conversion means to pass therethrough and preventing illuminating light from said lens barrel side from passing therethrough.

2. The wire bonding apparatus according to claim 1, wherein said wavelength-selective filter is disposed above a reflective member which is provided in said light path conversion means and reflects said image of said area near said lower end of said tool upward.

3. The wire bonding apparatus according to claim 1, wherein said wavelength-selective filter is disposed on an image-light incident side of a reflective member which is provided in said light path conversion means and reflects said image of said area near said lower end of said tool upward.

4. The wire bonding apparatus according to claim 1, wherein said wavelength-selective filter is inclined at an angle that is greater than numerical aperture of said lens barrel of said position detection camera.

* * * * *